(12) United States Patent
Lai et al.

(10) Patent No.: US 8,816,423 B2
(45) Date of Patent: Aug. 26, 2014

(54) SEMICONDUCTING MULTI-LAYER STRUCTURE AND METHOD FOR MANUFACTURING THE SAME

(75) Inventors: Erh-Kun Lai, Taichung (TW); Yen-Hao Shih, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 40 days.

(21) Appl. No.: 13/584,366

(22) Filed: Aug. 13, 2012

(65) Prior Publication Data
US 2014/0042629 A1 Feb. 13, 2014

(51) Int. Cl.
*H01L 29/792* (2006.01)

(52) U.S. Cl.
USPC ...... 257/324; 257/773; 257/774; 257/E27.06; 257/E21.645; 438/257; 438/270; 438/618

(58) Field of Classification Search
USPC ............ 257/758, E29.17, E21.645–E21.694, 257/324, 773, 774, E27.06; 438/257, 270, 438/618
See application file for complete search history.

(56) References Cited

U.S. PATENT DOCUMENTS

| | | | |
|---|---|---|---|
| 6,242,796 B1 * | 6/2001 | Sim et al. | 257/664 |
| 7,768,133 B2 * | 8/2010 | Matsui et al. | 257/774 |
| 2011/0147801 A1 * | 6/2011 | Shim et al. | 257/211 |

* cited by examiner

*Primary Examiner* — Jasmine Clark
(74) *Attorney, Agent, or Firm* — McClure, Qualey & Rodack, LLP

(57) ABSTRACT

A semiconducting multi-layer structure comprising a plurality of first conductive layers, a plurality of first insulating layers and a second conductive layer is disclosed. The first conductive layers are separately disposed. Each of the first conductive layers has an upper surface, a bottom surface opposite to the upper surface and a lateral surface. The first insulating layers surround the peripherals of the first conductive layers. Each of the first insulating layers covers at least a part of the upper surface of each of the first conductive layers, at least a part of the bottom surface of each of the first conductive layers and the two lateral surface of each of the first conductive layers. The second conductive layer covers the first conductive layers and the first insulating layers.

18 Claims, 3 Drawing Sheets

SEMICONDUCTING MULTI-LAYER STRUCTURE AND METHOD FOR MANUFACTURING THE SAME

BACKGROUND OF THE INVENTION

1. Field of the Invention

The invention is related to a semiconducting multi-layer structure and method for manufacturing the same, and more particularly to a semiconducting multi-layer structure of a memory device.

2. Description of the Related Art

The demand of memory devices increases complying with a growth in market of the electronic products. There are several types of memory devices, such as volatile and non-volatile memory (NVM) devices.

The dynamic random access memory (DRAM) and the cache memory are volatile memories. Although a read access velocity of a volatile memory is fast, a non-volatile memory can be used as a hard disk since data stored in non-volatile memories will exist even when the current pinch off. According to read/write characteristic differences of memory devices, the non-volatile memory can be separated into read only memory (ROM) and flash memory. Recently, flash memory has been widely used in a variety of filed, such as cell phone, digital camera and MP3.

In order to increase a storage capacity of the memory in a limited memory volume, a three dimensional (3D) memory is developed. In a 3D memory, pitches between each elements are smaller and an element density in an unit area of the 3D memory is larger.

SUMMARY OF THE INVENTION

The invention is related to a semiconducting multi-layer structure and method for manufacturing the same. A current channel can be formed in the semiconducting multi-layer structure, without operating an ion implantation process to the semiconducting multi-layer structure.

According to a first aspect of the present invention, a semiconducting multi-layer structure comprising a plurality of first conductive layers, a plurality of first insulating layers and a second conductive layer is disclosed. The first conductive layers are separately disposed. Each of the first conductive layers has an upper surface, a bottom surface opposite to the upper surface and a lateral surface. The first insulating layers surround the peripherals of the first conductive layers. Each first insulating layer covers at least a part of the upper surface of each of the first conductive layers, at least a part of the bottom surface of each of the first conductive layers and the lateral surface of each of the first conductive layers. The second conductive layer covers the first conductive layers and the first insulating layers.

According to a second aspect of the present invention, a method for manufacturing a semiconducting multi-layer structure, comprising following steps is disclosed. A plurality of first conductive layer spaced apart from each other are forming. Each of the first conductive layers has an upper surface, a lower surface opposite to the upper surface and a lateral surface. A plurality of first insulating layers surrounding peripherals of the first conductive layers are formed. Each of the first insulating layers covers at least a part of the upper surface, a part of the lower surface and the lateral surface of the first conductive layer. A second conductive layer covering the first conductive layers and the first insulating layers is formed.

According to a third aspect of the present invention, a semiconducting multi-layer structure used in a memory device is disclosed. The semiconducting multi-layer structure comprises a plurality of conductive layers, a plurality of gate oxide layers and a gate layer. The conductive layers are spaced apart from each other. Each of the conductive layers has an upper surface, a lower surface opposite to the upper surface and a lateral surface. The gate oxide layers surround peripherals of the conductive layers. Each of the gate oxide layers covers at least a part of the upper surface, a part of the lower surface and the lateral surface of the conductive layers. The gate layer covers the conductive layers and the gate oxide layers.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
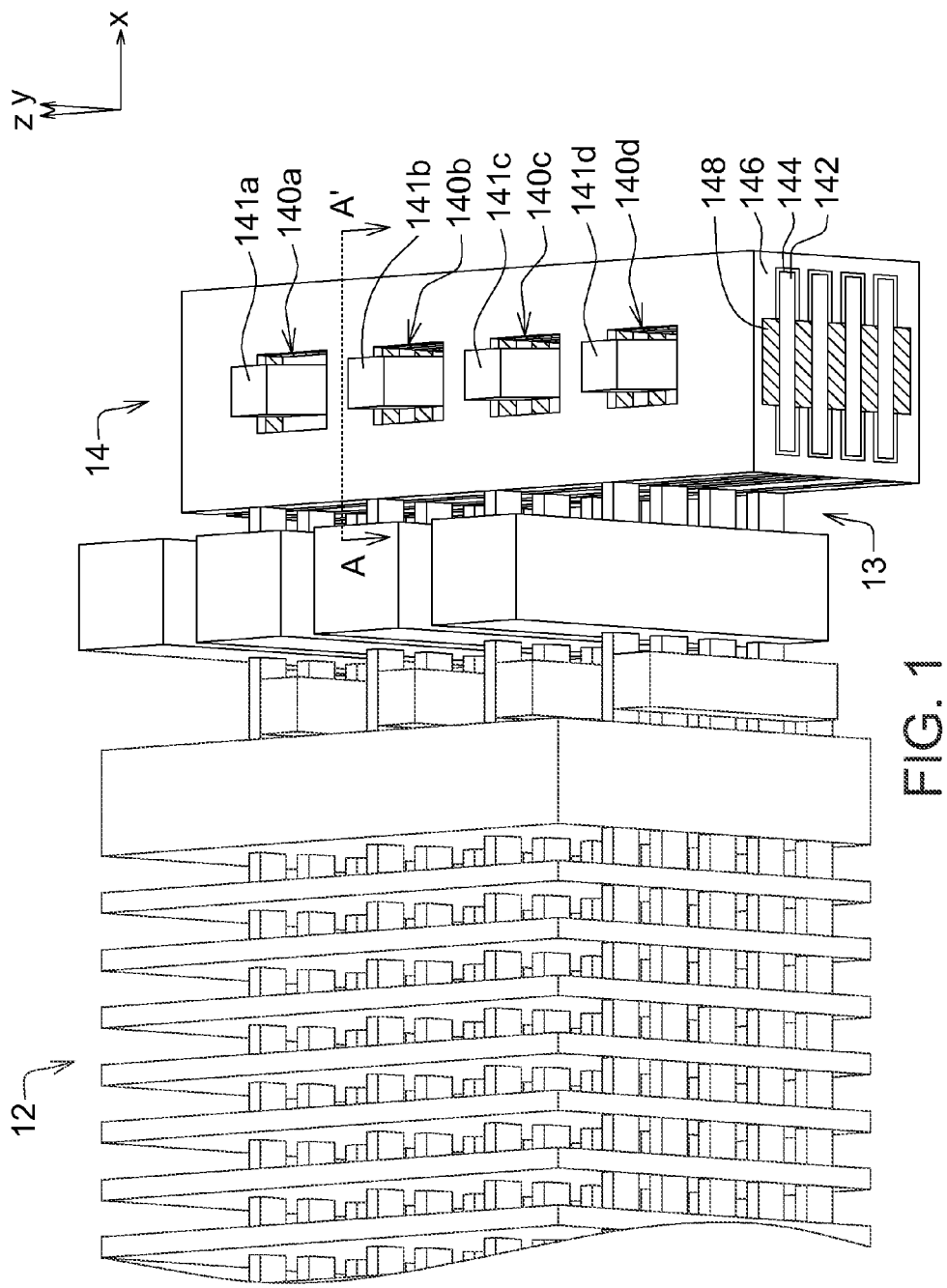
FIG. 1 shows a local diagram of a memory device according to an embodiment of the invention.

FIG. 1 illustrates a local diagram of a memory device according to an embodiment of the invention. Referring to FIG. 1, memory device 10 has an array region 12, interfingering structure 13 and a semiconducting multi-layer structure 14. The memory device 10 can be, for example, a three dimensional NAND flash memory. The x axis, y axis and z axis are perpendicular to each other. The semiconducting multi-layer structure 14 comprises a first conductive layer 142, a first insulating layer 144, a second conductive layer 146, a second insulating layer 148, via 140a, via 140b, via 140c, via 140d, third conductive layer 141a, third conductive layer 141b, third conductive layer 141c and third conductive layer 141d.

The first conductive layers 142 can comprise polysilicon material. The first insulating layers 144 can be gate oxide layers formed of oxide, the second conductive layer 146 can be an assist gate layer covers the first conductive layers 142 and the first insulating layers 144. The second insulating layers 148 can be a oxide layer comprising oxide. The second insulating layers 148 and the first conductive layers 142 are interlaced arranged. In one embodiment, the second insulating layers 148 can be removed and the first conductive layers 142 can be supported by the interfingering structure 13.

The vias 140a~140d can be contacts. The depths of two adjacent vias 140a~140d are different. The vias 140a~140d pass through at least one of the first conductive layers 142. for example, as shown in FIG. 1, the semiconducting multi-layer structure 14 has four vias 140a~140d, each of the vias 140a~140d pass through the semiconducting multi-layer structure 14 with different depth. The passing through depth of the vias 140a~140d can be increased one by one. From top to the bottom, the via 140a passes through the semiconducting multi-layer structure 14 to a first one of the first conductive layer 142. The via 140b passes through the semiconducting multi-layer structure 14 to a second one of the first conductive layer 142. The via 140c passes through the semiconducting multi-layer structure 14 to a third one of the first conductive layer 142. The via 140d passes through the semiconducting multi-layer structure 14 to a fourth one of the first conductive layer 142. A number of the vias 140a~140d is related to a number of the first conductive layers 142. The vias 140a~140d are filled with the third conductive layers 141a~141d, respectively. The third conductive layer 141a~141d can be conductive contact layer for electrically connected to a corresponding one of the first conductive layers 142. In this embodiment shows a four-layer stacked first conductive layers 142 as an example. In other embodiment, the number of the first conductive layers 142 can be adjusted according to the requirement of the manufacturing process and the process.

In this embodiment, a pitch between the elements are reduced and an element density in the unit area is increased for improving the storage capacity and size miniaturization. Therefore, junctions can be formed between the first conductive layers 142 by applying voltages to the semiconducting multi-layer structure 14 without ion implantation. The three dimensional memory device 10 in FIG. 1 is a type of this junction-free 3D memory.

By controlling the on/off voltage applying to the third conductive layer 141a~141d, the first conductive layers 142 can be selected. In one embodiment, the second conductive layer 146 of the semiconducting multi-layer structure 14 can be patterned to a connecting layer, to connect the first conductive layers 142 selected by the semiconducting multi-layer structure 14 to the array region 12. However, since the second conductive layer 146 can comprises polysilicon, the second conductive layer 146 without ion implantation can has large voltage resistance, thereby affecting the read/write velocity of the memory device 10. When a number of stacked layers is large, ions can not be implanted to the semiconducting multi-layer structure 14 uniformly by the ion implant process. In other words, an upper layer structure can receive high concentration ions implanted while a lower layer structure receive low concentration ions implanted. If implanting ions to each layer individually, a plurality of masks are required in the manufacturing process and thereby causing large manufacturing cost.

In one embodiment of the invention, by disposing the first insulating layers 144 between the first conductive layers 142 and the second conductive layer 146, a inversion layer (current channel) can be formed between the first conductive layers 142 and the first insulating layer 144 after the voltage applied to the second conductive layer 146. Therefore, the resistance of the second conductive layer 14 can be reduced without any ion doping and ion implantation process. The velocity of read/write process of the memory device can be improved.

Figure 2:
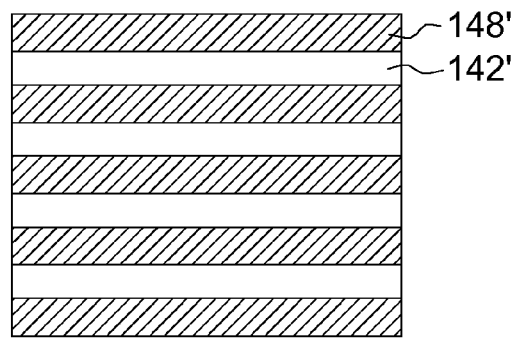
FIGS. 2~5 illustrate cross-section manufacturing flow charts of the semiconducting multi-layer structure in FIG. 1 along line A-A'.
Figure 3:
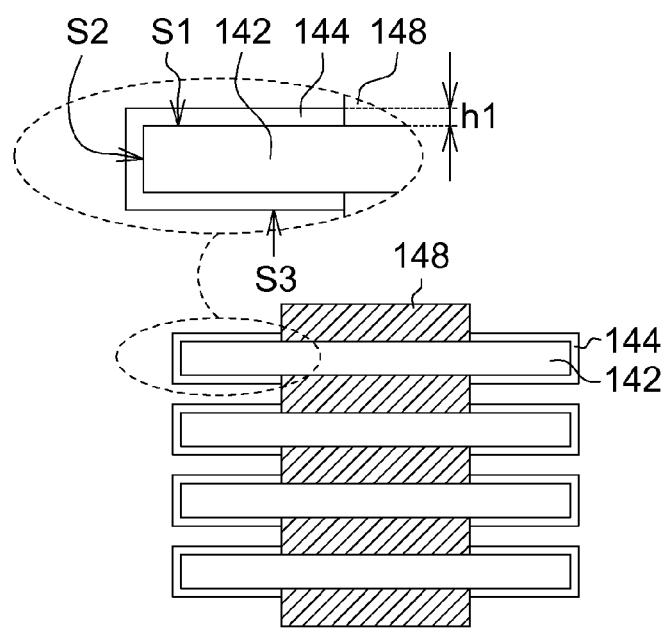

FIGS. 2~5 illustrate cross-section manufacturing flow charts of the semiconducting multi-layer structure 14 in FIG. 1 along line A-A'. Referring to FIG. 2, a conductive material 142' and insulating material 148' are interlacedly disposed and provided. The conductive material 142' can comprise polysilicon, the insulating material 148' can comprise oxide. Referring to FIGS. 2~3, a mask process is operated to pattern the insulating material 148'. The insulating material 148' can be patterned by wet etching with buffer oxide etch (BOE). The exposed insulating material 148', which is not covered by the conductive material 142', is etched. That is to say, the two sides of the insulating material 148' are removed to form the second insulating layer 148. After the patterning process, a width of the first conductive layers 142 is larger than a width of the second insulating layers 148.

Referring to FIG. 3, the first conductive layers 142 and the second insulating layers 148 are interlaced to each other. Each of the first conductive layers 142 has an upper surface S1, a lateral surface S2 and a lower surface S3, the lower surface S3 is opposite to the upper surface S1. Then, the first insulating layers 144 surround peripherals of the first conductive layers 142 are formed, the first insulating layers 144 cover at least a part of the upper surface S1 of the first conductive layers 142, lateral surface S2 of the first conductive layers 142 and a part of the lower surface of the first conductive layers 142. The insulating layer can be formed by oxide deposition or thermal oxidation process. The first insulating layer 144 has a thickness h1, the thickness h1 is between 2 nm to 500 nm. Preferably, the thickness h1 is between 2 nm to 100 nm.

Figure 4:
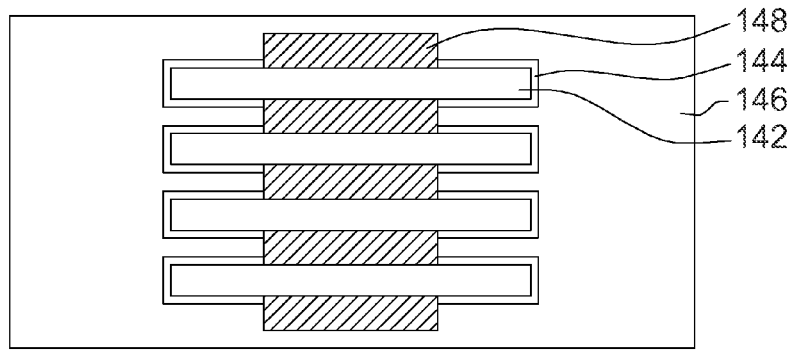
Figure 5:
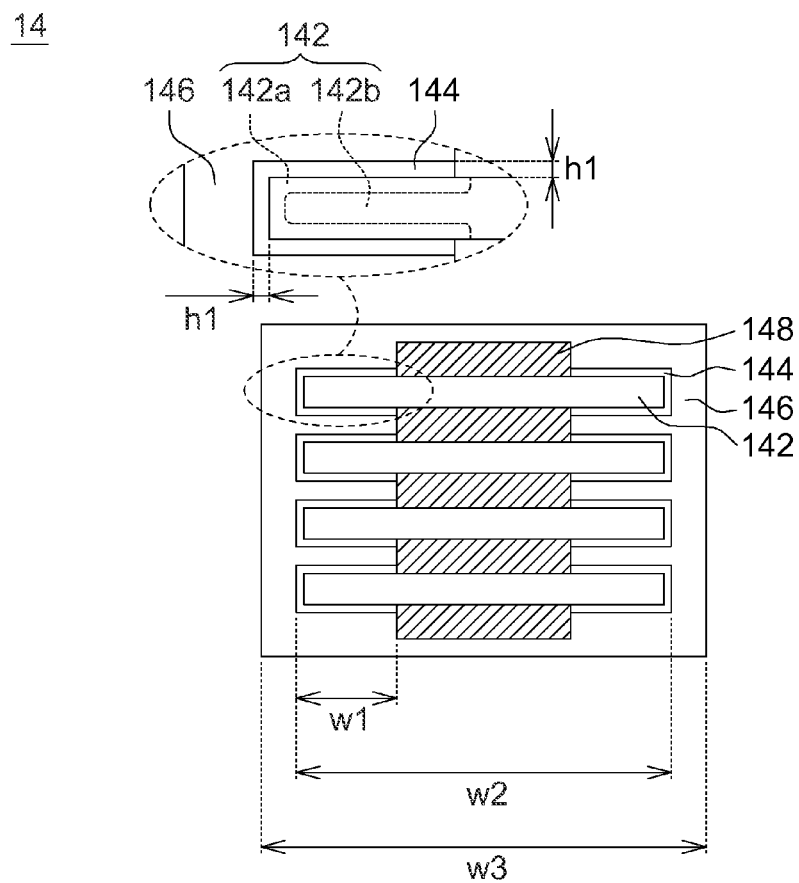

Referring to FIG. 4, a conductive material 146' is formed. The conductive material 146' van be formed by polysilicon deposition to cover the first conductive layers 142 and the first insulating layers 144. Referring to FIGS. 4~5, the conductive material 146' is patterned to form the second conductive layer 146. In one embodiment, voltage can be applied to the second conductive layer 146, and an inversion layer 142a can be formed at the junction between the first conductive layers 142 and the first insulating layers 144, and a non-inversion layer 142b is formed at the other part of the first conductive layers 142.

Referring to FIG. 5, the width w2 of the second conductive layer 146 is larger than a summation of the width w3 of the first conductive layers 142 and the thickness h1 of the first insulating layers 144. In one embodiment, the thickness h1 of the first insulating layers 144 can be 2 nm to 500 nm, preferably arranged from 2 nm to 100 nm. The thickness h1 of the first insulating layers 144 can be adjusted according to a resistance of the inversion layer 142a. The width w3 of the first conductive layers 142 can be 100 nm to 700 nm, the width w2 of the second conductive layer 146 can be 200 nm to 1500 nm. The first insulating layers 144 cover the part of the upper surface S1 of the first conductive layers 142, the width w1 of the covered upper surface S1 is 5 nm to 1000 nm.

Based on the above, the semiconducting multi-layer structure in the embodiments of the invention can be applied to a three dimensional memory device. The semiconducting multi-layer structure can be manufactured without ion implantation process and complicated mask process. Because of the structure with junctions between the first conductive layers, the insulating layers and the second conductive layer (assist gate layer), when voltage applied to the second conductive layer (assist gate layer), an inversion layer can be formed at the junction between the first conductive layer and the insulating layer so that the resistance of the junction between the first conductive layer and the insulating layer can be reduced and the velocity of current conduction can be increased. Therefore, the read/write velocity of the three dimensional memory device can be improved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconducting multi-layer structure, comprising:
a plurality of first conductive layers, spaced apart from each other, each of the first conductive layers having an upper layer, a lower layer opposite to the upper layer and a lateral surface;
a plurality of first insulating layers, surrounding peripherals of the first conductive layers, each of the first insu- lating layers covering a part of the upper surface, a part of the lower surface and the lateral surface of each of the first conductive layers;
a second conductive layer, covering the plurality of first conductive layers and the plurality of first insulating layers; and
a plurality of second insulating layers, interlacedly arranged with the first conductive layers, wherein a width of the each first conductive layer is larger than a width of the each second insulating layer.

2. The semiconducting multi-layer structure according to claim 1, wherein the each first conductive layer comprises polysilicon material, the each first insulating layer is an oxidation layer, the second conductive layer comprises another polysilicon material, the each second insulating layer is another oxidation layer.

3. The semiconducting multi-layer structure, according to claim 1, further comprising:
a plurality of vias, a number of the vias is related to a number of the first conductive layers, the vias passing through at least one of the first conductive layers, and depths of two of the adjacent vias are different; and
a plurality of third conductive layer, disposed in the vias for electrically connected to a corresponding first conductive layer of the first conductive layers.

4. The semiconducting multi-layer structure according to claim 1, wherein a width of the each first conductive layer is smaller than a width of the each second conductive layer.

5. The semiconducting multi-layer structure according to claim 1, wherein a width the each first conductive layer is between 100 nm to 700 nm, a width of the each second conductive layer is between 200 nm to 1500 nm.

6. The semiconducting multi-layer structure according to claim 1, wherein the each first insulating layer covers the part of the upper surface of the each first conductive layer, the width of the part is between 5 nm to 1000 nm.

7. A method for manufacturing a semiconducting multi-layer structure, comprising:
forming a plurality of first conductive layers spaced apart from each other, each of the first conductive layers having an upper surface, a lower surface opposite to the upper surface and a lateral surface;
forming a plurality of first insulating layers surrounding peripherals of the first conductive layers, each of the first insulating layers covering at least a part of the upper surface, a part of the lower surface and the lateral surface of each of the first conductive layers; and
forming a second conductive layer covering the first conductive layers and the first insulating layers;
wherein before forming the first insulating layers, the method further comprising:
forming a plurality of second insulating materials interlacedly arranged with the first conductive layer; and
removing two lateral sides of the second insulating materials to form second insulating layers, such that a width of the each first conductive layer is larger than a width of the each second insulating layer.

8. The method for manufacturing the semiconducting multi-layer structure according to claim 7, wherein removing the two lateral sides of the second insulating materials comprises:
utilizing buffer oxide etch (BOE) to etch the two lateral sides of the second insulating materials.

9. The method for manufacturing the semiconducting multi-layer structure according to claim 7, wherein removing the two lateral sides of the second insulating materials, comprising:
providing the second insulating materials interlacedly arranged with the first conductive layers; and
utilizing a lithography process to etch the two lateral sides of the second insulating materials to form the second insulating layers.

10. The method for manufacturing the semiconducting multi-layer structure according to claim 9, wherein the two lateral sides of the second insulating materials are wet etched according to a selection ratio difference between the second insulating materials and the first conductive layers.

11. The method for manufacturing the semiconducting multi-layer structure according to claim 7, wherein forming the first insulating layers comprising:
operating an oxidation process to form the first insulating layers surrounding surfaces of the first conductive layers.

12. The method for manufacturing the semiconducting multi-layer structure according to claim 7, further comprising:
forming a plurality of vias passing through at least one of the first conductive layers, the depths of two of the adjacent vias are different, wherein a number of the vias is related to a number of the first conductive layers; and
forming a plurality of third conductive layers in the vias respectively, for electrically connected to a corresponding first conductive layer of the first conductive layers.

13. A semiconducting multi-layer structure, the semiconducting multi-layer structure being used in a memory device, the semiconducting multi-layer structure comprising:
a plurality of conductive layers, the conductive layers spaced apart from each other, each of the conductive layers having an upper surface, a lower surface opposite to the upper surface and a lateral surface;
a plurality of gate oxide layers, surrounding peripherals of the conductive layers, each of the gate oxide layers covering at least a part of the upper surface, a part of the lower surface and the lateral surface of the conductive layers; and
a gate layer covering the conductive layers and the gate oxide layers.

14. The semiconducting multi-layer structure according to claim 13, further comprising:
a plurality of insulating layers, interlacedly arranged with the conductive layers, wherein a width of the each conductive layer is larger than a width of the each insulating layer; and
a gate layer covering the conductive layers and the gate oxide layers.

15. The semiconducting multi-layer structure according to claim 14, wherein the conductive layers comprises polysilicon, the gate layer comprises another polysilicon, and the insulating layers are oxide layers.

16. The semiconducting multi-layer structure according to claim 13, further comprising:
a plurality of contacts, a number of the contacts is related to a number of the conductive layers, the contacts passing through at least one of the conductive layers, and depths of two of the adjacent contacts are different; and
a plurality of the conductive contacting layers filled in the contacts, for electrically connected to a corresponding conductive layer of the conductive layers.

17. The semiconducting multi-layer structure according to claim 13, wherein a width of the each conducting layer is smaller than a width of the gate layer.

18. The semiconducting multi-layer structure according to claim 17, wherein the width of the each conductive layer is between 100 nm to 700 nm, the width of the gate layer is between 200 nm 1500 nm, the part of the upper surface of the conductive layers covered by each of the gate oxide layers has a width between 5 nm to 1000 nm.

* * * * *